(12) United States Patent
Chen et al.

(10) Patent No.: US 11,569,418 B2
(45) Date of Patent: Jan. 31, 2023

(54) LIGHT-EMITTING DIODE GRAIN STRUCTURE WITH MULTIPLE CONTACT POINTS

(71) Applicant: EXCELLENCE OPTO. INC., Miaoli County (TW)

(72) Inventors: Fu-Bang Chen, Miaoli County (TW); Kuo-Hsin Huang, Miaoli County (TW)

(73) Assignee: EXCELLENCE OPTO. INC., Hsinchu Science Park (TW)

( * ) Notice: Subject to any disclaimer, the term of this patent is extended or adjusted under 35 U.S.C. 154(b) by 18 days.

(21) Appl. No.: 17/208,285

(22) Filed: Mar. 22, 2021

(65) Prior Publication Data
US 2022/0302353 A1 Sep. 22, 2022

(51) Int. Cl.
*H01L 33/38* (2010.01)
*H01L 33/40* (2010.01)
*H01L 33/06* (2010.01)

(52) U.S. Cl.
CPC ............ *H01L 33/387* (2013.01); *H01L 33/06* (2013.01); *H01L 33/405* (2013.01)

(58) Field of Classification Search
CPC ... H01L 33/382; H01L 33/385; H01L 33/387; H01L 33/06; H01L 33/405
See application file for complete search history.

(56) References Cited

U.S. PATENT DOCUMENTS

| 8,319,250 B2 | 11/2012 | Rode et al. | |
| 2013/0187122 A1* | 7/2013 | Lee | H01L 33/405 257/9 |
| 2016/0372635 A1* | 12/2016 | Ko | H01L 33/382 |

FOREIGN PATENT DOCUMENTS

| CN | 102456790 A | * | 5/2012 |
| JP | 2006156590 A | * | 6/2006 |

* cited by examiner

*Primary Examiner* — Latanya N Crawford Eason
(74) *Attorney, Agent, or Firm* — Muncy, Geissler, Olds & Lowe, P.C.

(57) ABSTRACT

The invention provides a light-emitting diode grain structure with multiple contact points, including a P-type electrode, a conductive base plate, a light-emitting semiconductor layer, a plurality of ohmic contact metal points, a mesh-structured connection conductive layer, a connection point conductive layer, and an N-type electrode pad electrically connected to the connection point conductive layer. The plurality of ohmic contact metal points is arranged on an N-type semiconductor layer in a spreading manner, and is contacted with the N-type semiconductor layer. No ohmic contact is formed between the connection conductive layer and the N-type semiconductor layer. Accordingly, the metal points and the connection conductive layer can disperse a current, reduce a shading area, and improve the luminous efficiency and component reliability; and uniform light emission from a surface facilitates the light distribution uniformity of an original light source and exciting light after phosphor is coated.

12 Claims, 8 Drawing Sheets

LIGHT-EMITTING DIODE GRAIN STRUCTURE WITH MULTIPLE CONTACT POINTS

FIELD OF THE INVENTION

The present invention relates to a light-emitting diode, and in particular, to a light-emitting diode grain structure with multiple contact points.

BACKGROUND OF THE INVENTION

Referring to FIG. 1 and FIG. 2, a vertical light-emitting diode 1 can emit high-efficiency axial light which is very suitable for applications requiring high working current and high illuminance. A general structural design of the vertical light-emitting diode 1 has the following characteristics. An electrode pad 2 is located above the light-emitting diode 1 and is used for wire bonding, and usually a thicker gold wire is used to facilitate passing of a high current. Furthermore, a reference line 3 (Finger) that allows a current to flow vertically to a semiconductor and horizontally through a metal is located above the light-emitting diode 1 in the shape of a finger. If more reference lines 3 are set on the light-emitting diode 1, current dispersion is better, but a shading area would be also increased.

When the electrode pad 2 is formed in a center of the light-emitting diode 1, optical current dispersion is achieved, which can not only improve the luminous efficiency, but also have good heat dissipation. However, the vertical light-emitting diode 1 fails under the following situations: (1) Emitted light is excessively concentrated on the electrode pad 2 and the reference line 3 in a non-uniform manner, which will cause local hot spots so that the light-emitting diode 1 is easy to fail. (2) When a wire is bonded on the electrode pad 2 on a surface of the light-emitting diode 1, there is a risk of damaging a PN junction of the light-emitting diode 1, resulting in a decrease in yield and reliability.

Therefore, the U.S. Pat. No. 8,319,250 B2 provides a multi-conducting pillar technology. In order to make an N-type electrode serve as a bottom electrode and extend to form a plurality of side-wall-insulated vertical conductive pillars passing through a P-type semiconductor layer and a quantum well layer and entering an N-type semiconductor layer, a working current is uniformly dispersed in the N-type semiconductor layer, and a P-type electrode is arranged on a side edge for being used by wire bonding of a package procedure. This design can achieve the best dispersion of the working current via the multiple conductive pillars, and the wire bonding of the packaging procedure will not impact a light-emitting semiconductor layer either, thereby improving the failure mode of the foregoing vertical light-emitting diode 1. However, this structure contains a large number of precise conductive pillars, the diameter of which is usually 20 to 30 μm and the inner cylindrical walls of which are coated with an extremely thin insulation material. A cylindrical center layer is deposited with a highly conductive metal. This structure is fine but fragile, the process is complicated, the cost is high, process conditions are narrow, and failed products are not easy to be detected. The most serious is that when an external stress is extremely high (such as a physical contact with a surface, a deformation stress of the packaging procedure, and the like), the conductive pillars will have micro-cracks, causing an immediate failure of components or a long-term reliability problem. In addition, the design of the plurality of conductive pillars is better for nitride monocrystal optoelectronic semiconductors. For phosphide and arsenide single crystal optoelectronic semiconductors, their chemical properties are relatively unstable and require a lower defect density, so that it is more difficult to make the plurality of conductive pillars, and there is a risk of increasing the defect density. Therefore, this design is not applicable.

SUMMARY OF THE INVENTION

It is a primary object of the present invention to provide a light-emitting diode grain structure with multiple contact points to disperse a current and reduce a shading area.

The invention provides a light-emitting diode grain structure with multiple contact points, including a P-type electrode, a conductive base plate, a light-emitting semiconductor layer, a plurality of ohmic contact metal points, a connection conductive layer, a connection point conductive layer, and an N-type electrode pad. One side of the conductive base plate provided with the P-type electrode. The light-emitting semiconductor layer is arranged on the other side of the conductive base plate, and the light-emitting semiconductor layer comprises a P-type semiconductor layer arranged on the conductive base plate, a quantum well layer arranged on the P-type semiconductor layer, and an N-type semiconductor layer arranged on the quantum well layer. The plurality of ohmic contact metal points is arranged on the N-type semiconductor layer in a spreading manner, and the plurality of ohmic contact metal points contacts with the N-type semiconductor layer. The connection conductive layer is a mesh structure and covering the N-type semiconductor layer, the connection conductive layer is electrically connected to the plurality of ohmic contact metal points without ohmic contact formed between the connection conductive layer and the N-type semiconductor layer. The connection point conductive layer is arranged on the connection conductive layer, and the connection point conductive layer is electrically connected to the connection conductive layer. The N-type electrode pad is arranged on the connection point conductive layer, and the N-type electrode pad is electrically connected to the connection point conductive layer.

Accordingly, compared with the prior art, the invention has the advantages that since no ohmic contact is formed between the connection conductive layer and the N-type semiconductor layer, an operating current would not directly enter the N-type semiconductor layer when the operating current enters the connection conductive layer from the N-type electrode pad via the connection point conductive layer, but would be transmitted to the plurality of ohmic contact metal points via the connection conductive layer, and then enter the N-type semiconductor layer via the plurality of ohmic contact metal points. The plurality of ohmic contact metal points is arranged on the N-type semiconductor layer in a spreading manner, so that the current can be dispersed. In addition, the connection conductive layer is of the mesh structure with a small line width, so that the shading area can be reduced, and the light passing rate is increased. In addition, the invention simultaneously facilitates the light distribution uniformity of an original light source and exciting light after phosphor is coated, and can meet a use requirement of a backlight source of a display.

DETAILED DESCRIPTION OF THE PREFERRED EMBODIMENTS

Figure 1:
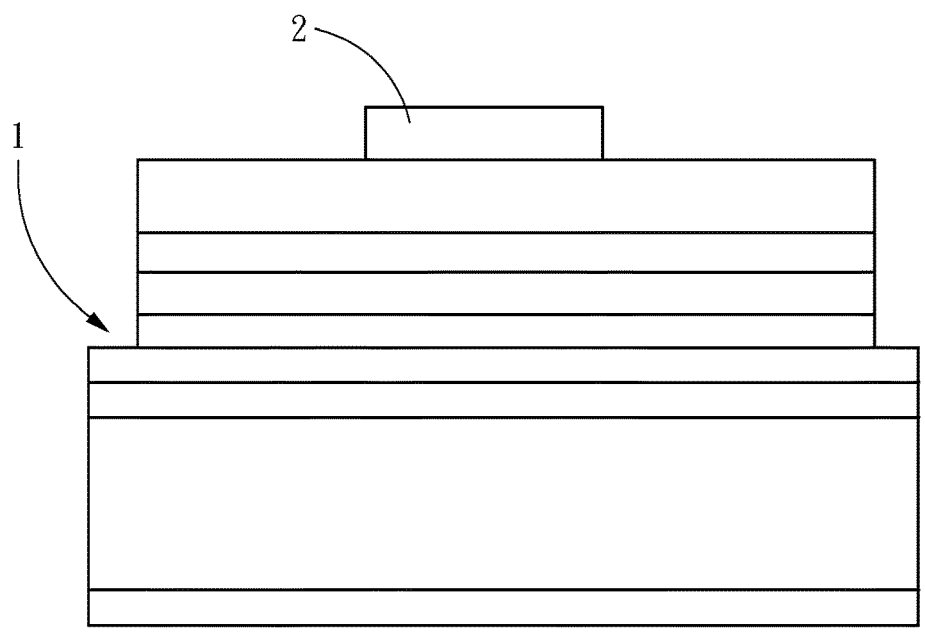
FIG. 1 is a schematic sectional diagram of a conventional structure.
Figure 2:
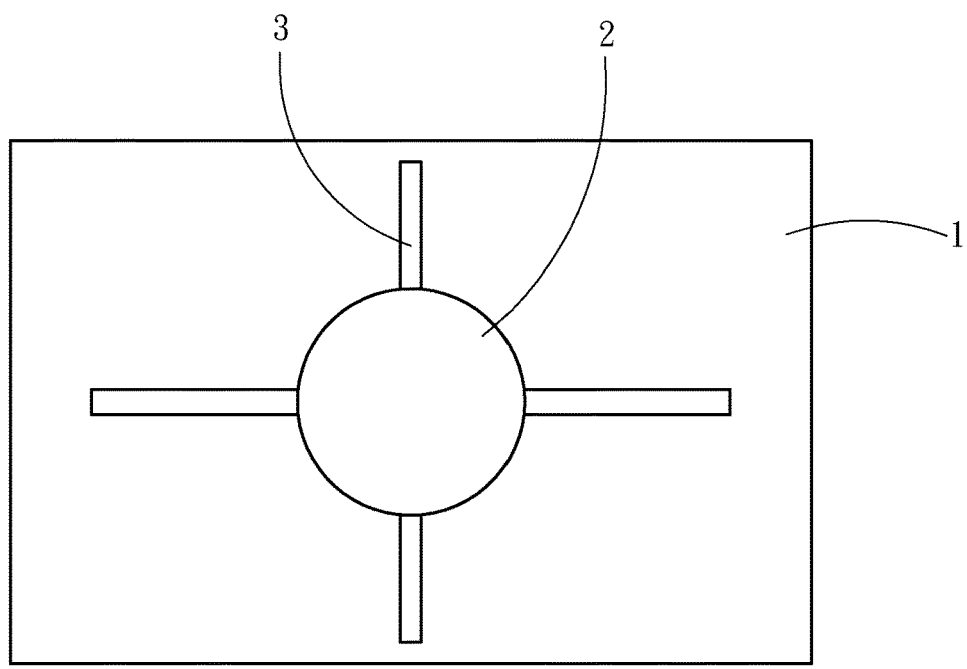
FIG. 2 is a top view of a conventional structure.
Figure 3:
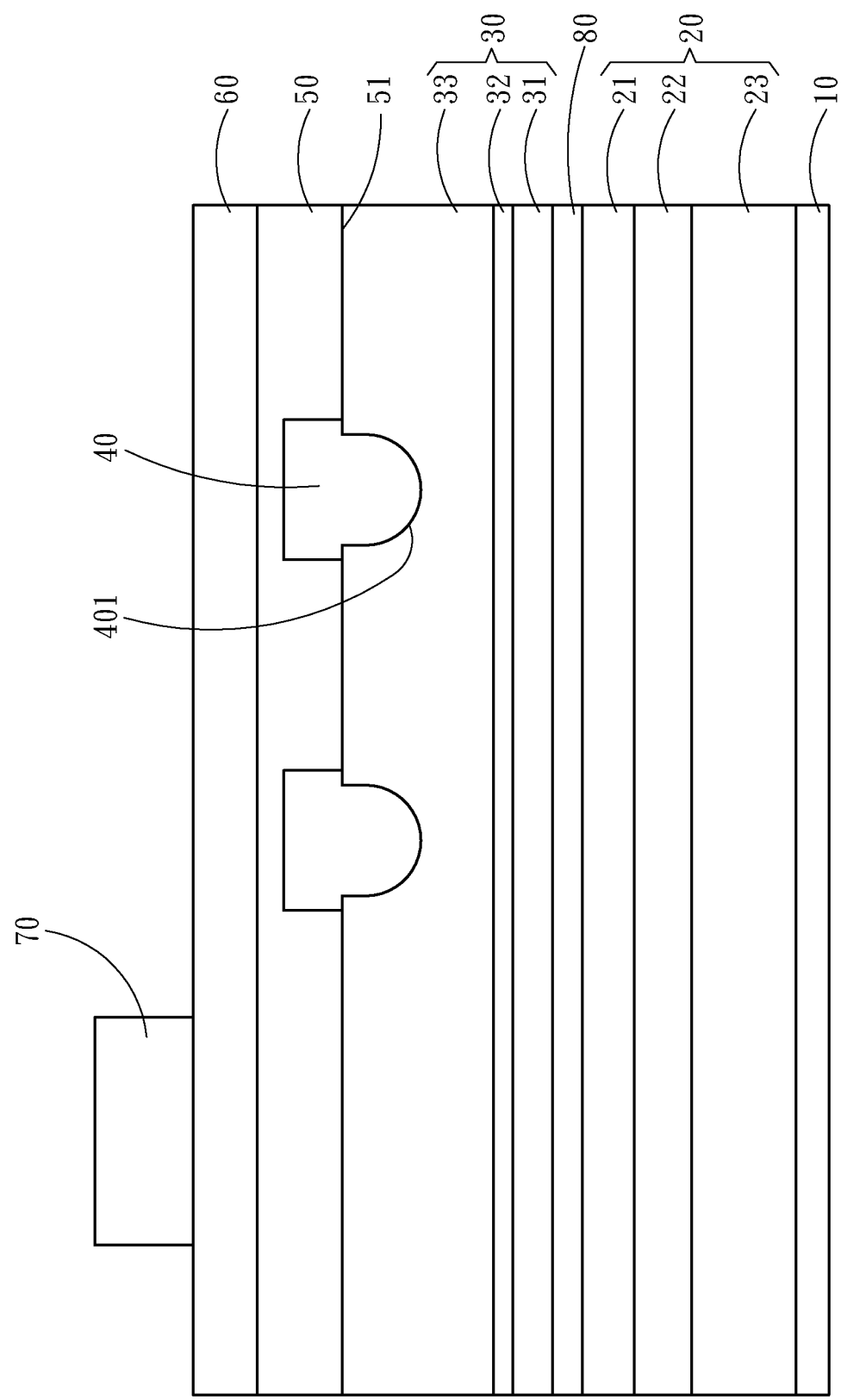
FIG. 3 is a schematic sectional diagram of a first embodiment of the invention.
Figure 4:
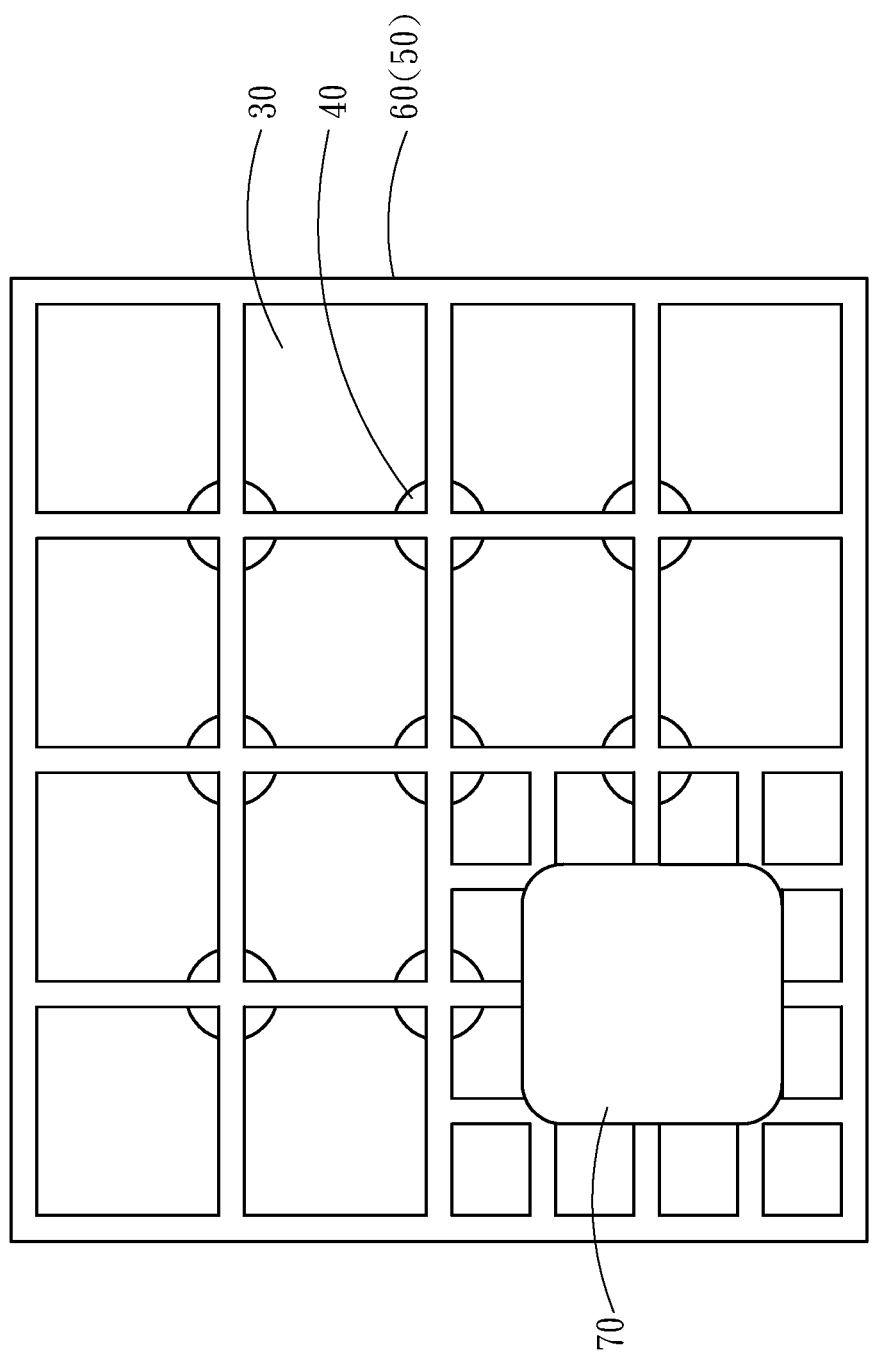
FIG. 4 is a top view of the first embodiment of the invention.

In order to have a deeper understanding and recognition of the features, objectives and effects of the present invention, a preferred embodiment is enumerated and illustrated with the drawings as follows:

Referring to FIG. 3 and FIG. 4, a first embodiment of the invention is illustrated. The invention is a light-emitting diode grain structure with multiple contact points. The light-emitting diode grain structure includes a P-type electrode 10, a conductive base plate 20, a light-emitting semiconductor layer 30, a plurality of ohmic contact metal points 40, a connection conductive layer 50, a connection point conductive layer 60, and an N-type electrode pad 70. One side of the conductive base plate 20 is provided with the P-type electrode 10, and the light-emitting semiconductor layer 30 is arranged on the other side of the conductive base plate 20. In one embodiment, the conductive substrate 20 is provided with a conductive metal light reflection layer 80 in a region adjacent to the light-emitting semiconductor layer 30. The conductive substrate 20 includes a buffer layer 21, a binding layer 22 and a substitutive base plate 23. The light-emitting semiconductor layer 30 is arranged on the buffer layer 21 with the conductive metal light reflection layer 80 therebetween. The P-type electrode 10 is arranged on a side of the substitutive base plate 23 opposite to the light-emitting semiconductor layer 30, and the binding layer 22 adheres and fixes the buffer layer 21 and the substitutive base plate 23. The light-emitting semiconductor layer 30 includes a P-type semiconductor layer 31 arranged on the conductive base plate 20, a quantum well layer 32 and an N-type semiconductor layer 33. The quantum well layer 32 is arranged on the P-type semiconductor layer 31, and the N-type semiconductor layer 33 is arranged on the quantum well layer 32.

The plurality of ohmic contact metal points 40 is arranged on the N-type semiconductor layer 33 of the light-emitting semiconductor layer 30 in a spreading manner, and the plurality of ohmic contact metal points 40 contacts with the N-type semiconductor layer 33. The connection conductive layer 50 is a mesh structure and covers the N-type semiconductor layer 33, the connection conductive layer 50 is electrically connected to the plurality of ohmic contact metal points 40 without ohmic contact formed between the connection conductive layer 50 and the N-type semiconductor layer 33. Specifically, the connection conductive layer 50 is made of a highly conductive metal which allows current to flow horizontally, that is, the connection conductive layer 50 conducts with the plurality of ohmic contact metal points 40 without conduction with the N-type semiconductor layer 33 below since an interface of the connection conductive layer 50 has a non-ohmic contact characteristic.

In addition, the connection point conductive layer 60 is arranged on the connection conductive layer 50 and covers the connection conductive layer 50, the connection point conductive layer 60 is electrically connected to the connection conductive layer 50. The connection point conductive layer 60 is a highly conductive and highly stable metal that needs to use a metal with chemical stability. In one embodiment, the connection point conductive layer 60 is made of a material such as gold (Au), platinum (Pt), and aluminum (Al), and the N-type semiconductor layer 33 is a nitride, phosphide or arsenide vertical grain.

The N-type electrode pad 70 is arranged on the connection point conductive layer 60, and the N-type electrode pad 70 is electrically connected to the connection point conductive layer 60. In one embodiment, the N-type electrode pad 70 is located above the N-type semiconductor layer 33. In one embodiment, as shown in FIG. 4, a setting position of the N-type electrode pad 70 is located at a side region of the N-type semiconductor layer 33 so as to avoid shading in wire bonding. Further, in one embodiment, in order to reduce an impact of a subsequent package and wire bonding procedure to the N-type semiconductor layer 33, a thickness of the N-type electrode pad 70 is greater than 2 μm, and the N-type electrode pad 70 is made of gold (Au). Accordingly, the N-type electrode pad 70 is made of a thicker gold with good ductility to absorb the impact force, avoiding damage to the N-type semiconductor layer 33.

Figure 5:
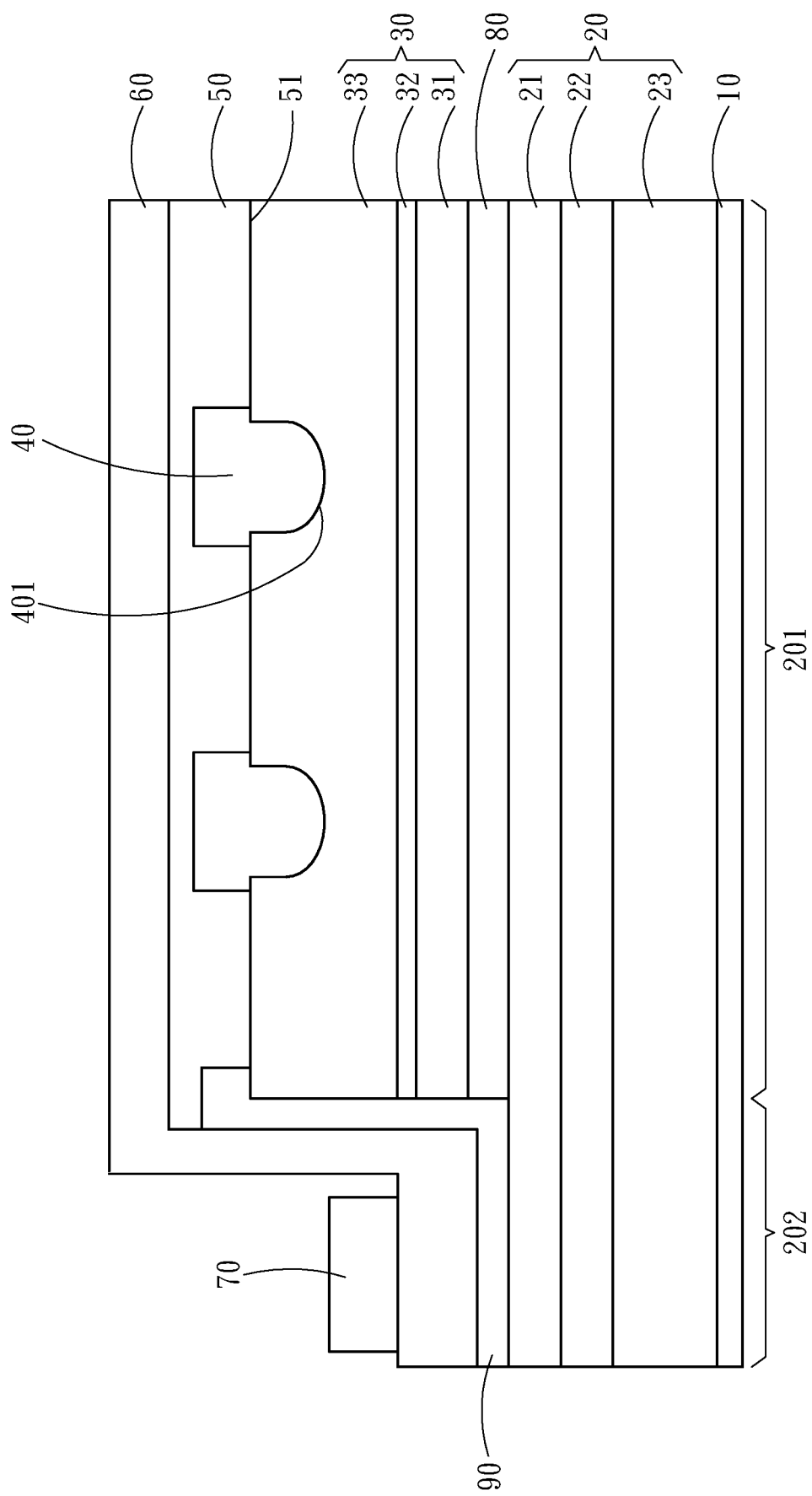
FIG. 5 is a schematic sectional diagram of a second embodiment of the invention.
Figure 6:
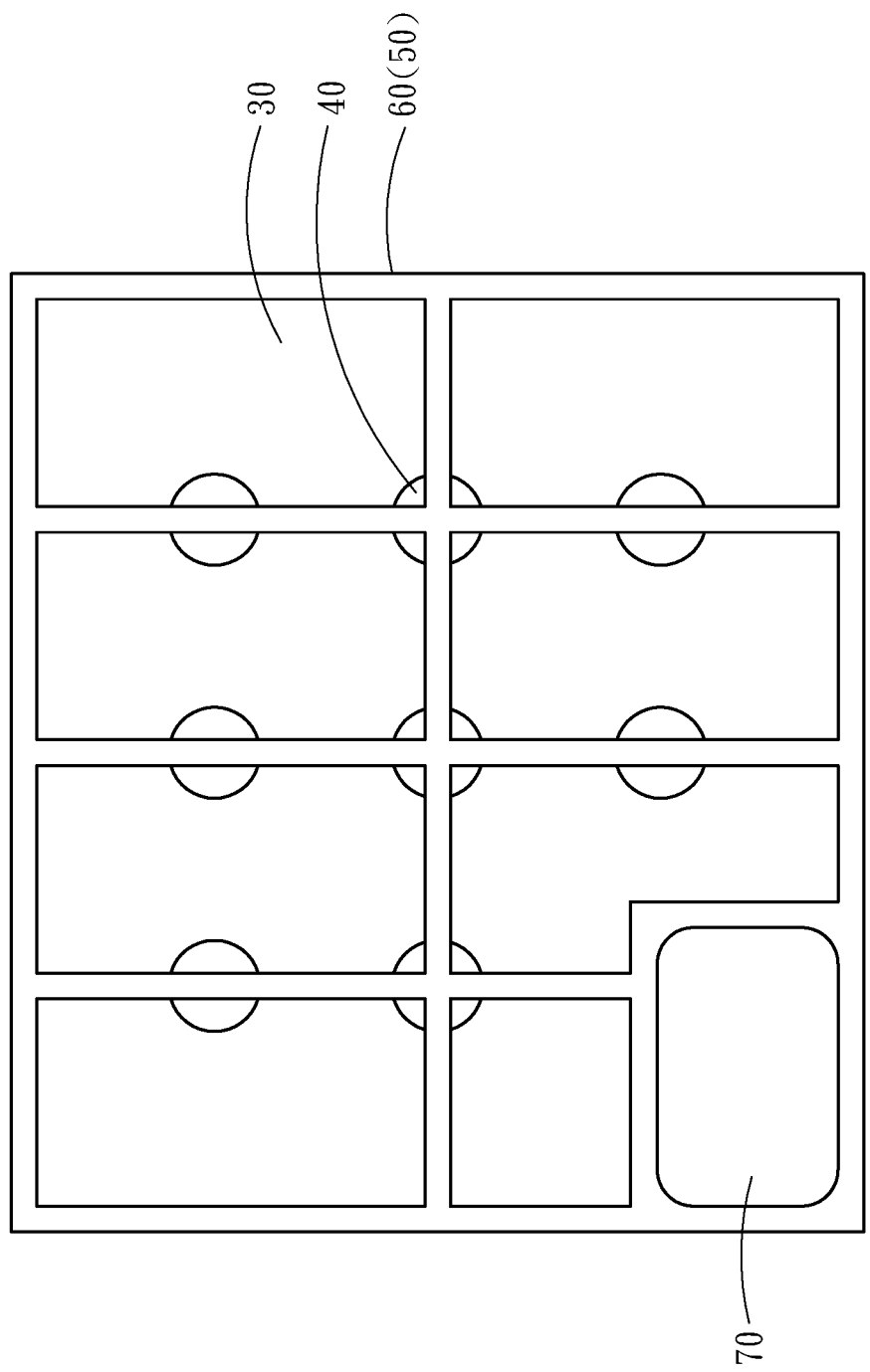
FIG. 6 is a top view of the second embodiment of the invention.

Referring to FIG. 5 and FIG. 6, a second embodiment of the invention is illustrated. Compared with the first embodiment, the second embodiment is that the conductive base plate 20 further includes a center region 201 and a side region 202 adjacent to the center region 201. The light-emitting semiconductor layer 30 is arranged on the center region 201 of the conductive base plate 20, the N-type semiconductor layer 33 and the side region 202 of the conductive base plate 20 are covered by an insulation layer 90. In one embodiment, the insulation layer 90 is made of silicon dioxide (SiO2), silicon nitride (SiN) or titanium dioxide (TiO2), and the like. The connection point conductive layer 60 further extends to the side region 202 of the conductive base plate 20, and is arranged on the insulation layer 90. The N-type electrode pad 70 is located above the side region 202. Accordingly, the N-type electrode pad 70 is not located above the N-type semiconductor layer 33 to avoid bonding damage to the N-type semiconductor layer 33 in the package and wire bonding procedure.

In the two foregoing embodiments, the plurality of ohmic contact metal points 40 includes a small area range, and is preferably circular. A material of the plurality of ohmic contact metal points 40 is a conductive metal to contact with the N-type semiconductor layer 33. For example, when the N-type semiconductor layer 33 is a nitride N-type semiconductor (N—GaN), chromium (Cr), aluminum (Al), titanium (Ti), and indium tin oxide (ITO) can be used as the plurality of ohmic contact metal points 40. When the N-type semiconductor layer 33 is a phosphide N-type semiconductor (N—$Al_xGa_{(1-x)}$)0.5In0.5P: X=0-1), GeAu can be used as the plurality of ohmic contact metal points 40. When the N-type semiconductor layer 33 is an arsenide N-type semiconductor (N—$Al_xGa_{(1-x)}$)0.5As: X=0-1), NiGeAu, GeAu, and Ti/Pt/Au can be used as the plurality of ohmic contact metal points 40. Therefore, the plurality of ohmic contact metal points 40 is in ohmic contact with the N-type semiconductor.

The connection conductive layer 50 is a conductive material which is in no ohmic contact with the N-type semiconductor layer 33. In actual implementation, there are at least several modes below.

A material of the connection conductive layer 50 is a conductive metal that is in non-ohmic contact with the N-type semiconductor layer 33. For example, when the N-type semiconductor layer 33 is a nitride N-type semiconductor (N—GaN), gold (Au), copper (Cu), platinum (Pt), and silver (Ag) can be used as the connection conductive layer 50. When the N-type semiconductor layer 33 is a phosphide N-type semiconductor (N—AlxGa(1-x)) 0.5In0.5P: X=0-1), gold (Au), copper (Cu), platinum (Pt), silver (Ag), and aluminum (Al) can be used as the connection conductive layer 50. When the N-type semiconductor layer 33 is an arsenide N-type semiconductor (N—AlxGa(1-x))0.5As: X=0-1), gold (Au), copper (Cu), platinum (Pt), silver (Ag), and aluminum (Al) can be used as the connection conductive layer 50. Therefore, the connection conductive layer 50 is in no ohmic contact with the N-type semiconductor layer 33 due to its material characteristic.

In other embodiment, as shown in FIG. 3 or FIG. 5, whether the N-type semiconductor layer 33 is a nitride, phosphide, or arsenide N-type semiconductor, a contact plane 51 between the N-type semiconductor layer 33 and the connection conductive layer 50 is passivated through ion bombardment, P-type dispersion or ion implantation, and the contact surface 51 will form an insulation interface and lose the characteristics of an N-type semiconductor, and will not form an ohmic contact with the N-type semiconductor layer 33.

Or, the contact plane 51 between the N-type semiconductor layer 33 and the connection conductive layer 50 is deposited by a thin film and covered by an insulation material, and the nitride, phosphide or arsenide N-type semiconductor can use SiO2, SiN, TiO2, Al2O3, SiC, and the like as the insulation material for thin film deposition, so that an insulation interface can also be formed to avoid the ohmic contact with the N-type semiconductor layer 33.

Figure 7:
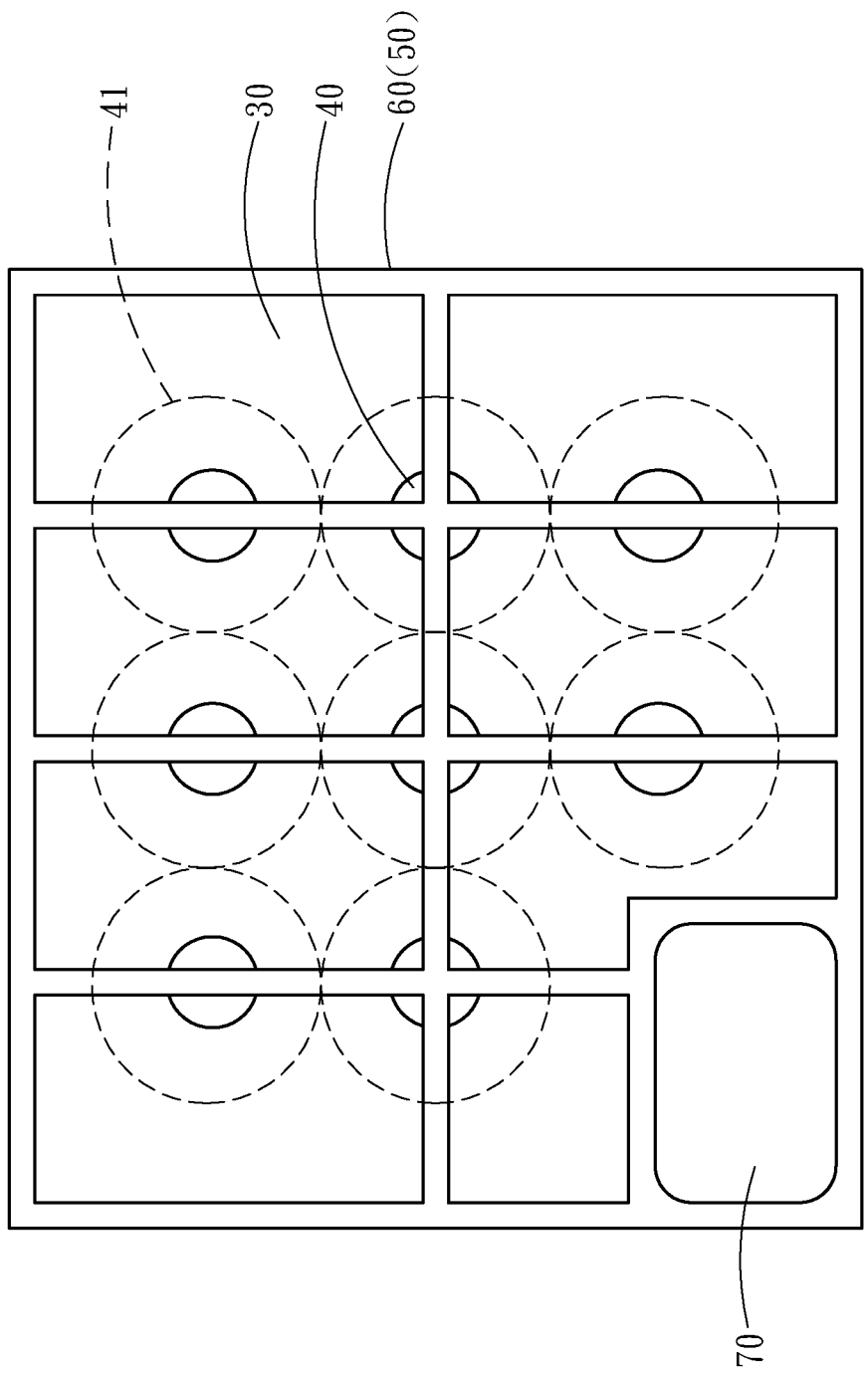
FIG. 7 is a schematic diagram of current dispersion of the second embodiment of the invention.

Referring to FIG. 3, FIG. 5, and FIG. 7, when the plurality of ohmic contact metal points 40 contact with the N-type semiconductor layer 33, and no ohmic contact is formed between the connection conductive layer 50 and the N-type semiconductor layer 33, an operating current (not shown) enters the connection conductive layer 50 from the N-type electrode pad 70 via the connection point conductive layer 60, and the current cannot directly enter the N-type semiconductor layer 33, but would be transmitted to the plurality of ohmic contact metal points 40 via the connection conductive layer 50 and then enter the N-type semiconductor layer 33 via the plurality of ohmic contact metal points 40. Therefore, each of the plurality of ohmic contact metal points 40 generates a current dispersion region 41 to effectively disperse the current.

Referring to FIG. 3 or FIG. 5, in order to enhance a luminance of the light-emitting diode grain structure, an electrode reflection plane 401 externally protruding towards the N-type semiconductor layer 33 is arranged between the plurality of ohmic contact metal points 40 and the N-type semiconductor layer 33, so as to improve the light extraction efficiency through multiple reflections of the electrode reflection plane 401 and the conductive metal light reflection layer 80.

Figure 8:
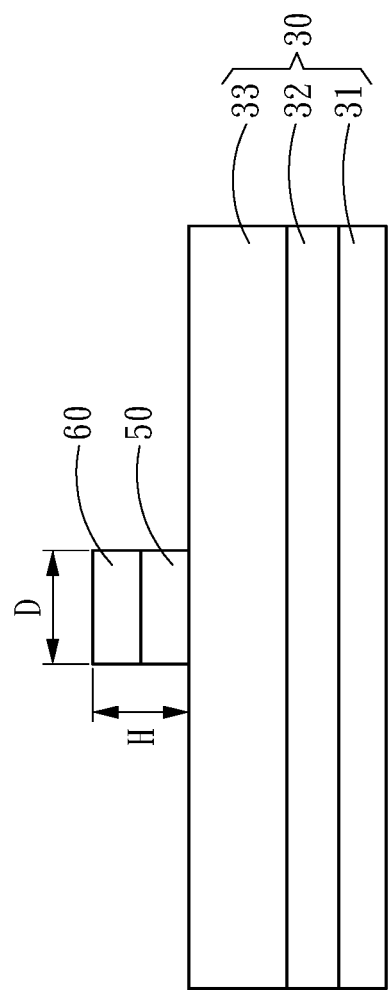
FIG. 8 is a schematic diagram of a size of a mesh structure of a conductive layer of the invention.

In addition, referring to FIG. 8, in one embodiment, a coverage area rate of the N-type semiconductor layer 33 covered by the connection conductive layer 50 is less than 30% to reduce the shading area of the connection conductive layer 50. In other embodiment, a light shading area is reduced in ways of reducing a line width D of the connection conductive layer 50 and the connection point conductive layer 60, wherein the line width D is controlled between 1 and 10 μm, or reducing quantities and areas of the plurality of ohmic contact metal points 40, and the like. In addition, in order to reduce the impedance of the operating current, the larger the sectional areas of the connection conductive layer 50 and the connection point conductive layer 60, the better. The sectional areas of the connection conductive layer 50 and the connection point conductive layer 60 is a product of an aggregate thickness H of the connection conductive layer 50 and the connection point conductive layer 60 and the line width D. However, increasing the line width D may enlarge the shading area, so that the aggregate thickness H of the connection conductive layer 50 and the connection point conductive layer 60 is increased, but an extremely large aggregate thickness H would cause a collapse problem. More specifically, if a ratio of the thickness H to the line width D is less than 0.5, there would be a shading deficiency that the line width is too extremely wide; and if the ratio is greater than 2.0, there is a collapse risk. Therefore, the ratio of the aggregate thickness H of the connection conductive layer 50 and the connection point conductive layer 60 to the line width D should be close to 1.0 preferably.

Figure 9:
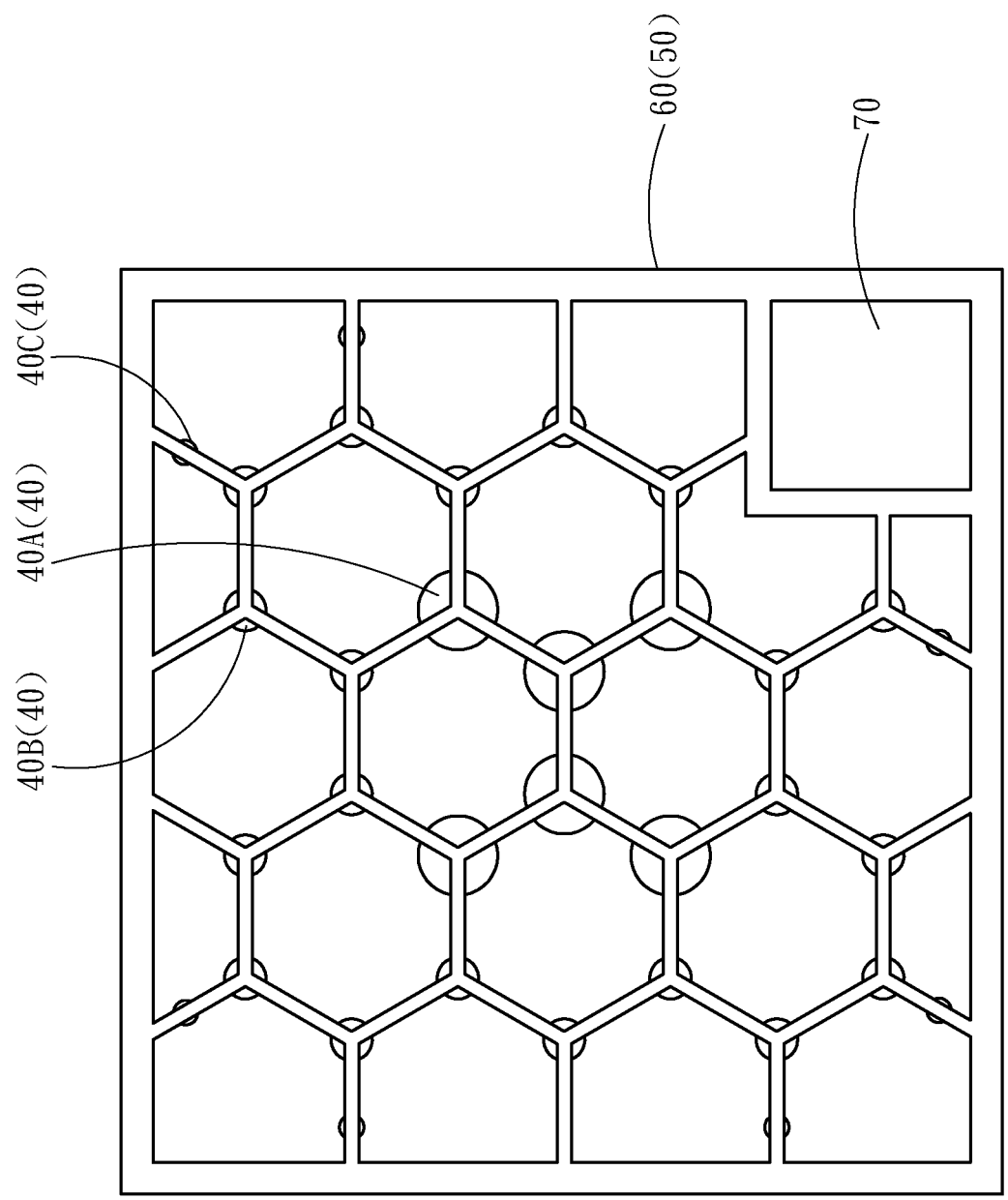
FIG. 9 is a schematic diagram of implementation of a mesh structure of a conductive layer of the invention.

Referring to FIG. 9, the connection conductive layer 50 is located below the connection point conductive layer 60, and is shielded by the connection point conductive layer 60. In one embodiment, an edge of the mesh structure of the connection conductive layer 50 is a closed geometric figure, but it is not limited to this, as long as the connection conductive layer 50 is electrically connected to the plurality of ohmic contact metal points 40. When the edge of the mesh structure of the connection conductive layer 50 is the closed geometric figure, it is represented that there may be more dispersion paths, and manufacturing of symmetric figures is efficient and easy to implement during a semiconductor procedure. As shown in FIG. 9, in one embodiment, the plurality of ohmic contact metal points 40 have different areas according to setting positions on the N-type semiconductor layer 33. More specifically, the areas of the plurality of ohmic contact metal points 40 at different positions may be changed according to an actual need. For example, ohmic contact metal points 40A, 40B, and 40C in three sizes: a large size, a medium size and a small size, can be used, wherein the large-size ohmic contact metal points 40A is arranged in the center region of the N-type semiconductor layer 33 to cause more current passing through the center region of the N-type semiconductor layer 33 to satisfy the light-emitting characteristic of the light-emitting semiconductor layer 30; the medium-size ohmic contact metal points 40B is disposed in an ordinary state; and the small-size ohmic contact metal points 40C is used for correcting distribution of a fine-tune current to meet requirements of actual use. In addition, the connection conductive layer 50 may be of a hexagonal staggered (honeycomb) mesh structure. The hexagonal staggered (honeycomb) mesh structure not only includes a completely closed geometric figure, but an enclosed region with a lower perimeter to area ratio. In addition, each crossing point can be provided with the plurality of ohmic contact metal points 40 to meet a requirement for homogenizing the current.

As mentioned above, the present invention at least includes characteristics as follows:

1. By use of the design that no ohmic contact is formed between the connection conductive layer and the N-type semiconductor layer, there is an ohmic contact formed between the plurality of ohmic contact metal points and the N-type semiconductor layer, and the plurality of ohmic contact metal points are disposed in the spreading manner, the current can be effectively dispersed; light is emitted uniformly, and local hotspots can also be avoided, and the component reliability is increased.

2. The invention has the characteristics of uniform light emission through the design of dispersing current, so that in an application of a nitride white light LED, uniform blue emitted light can be generated, which contributes to the light mixing uniformity after phosphor is excited.

3. The N-type electrode pad is located above the side region rather than on the N-type semiconductor layer, which can prevent the N-type semiconductor layer from being damaged in the package and wire bonding procedure; and in the package procedure, the N-type semiconductor layer is not pulled during wire bonding, so that a risk of cracking or separation is avoided.

4. A ratio of an aggregate thickness of the connection conductive layer and the connection point conductive layer to a line width is controlled to be less than 2.0, to reduce the shading area of the connection conductive layer and the connection point conductive layer to the maximum extent and minimize the current impedance. By use of the design of the electrode reflection plane and the conductive metal light reflection layer, twice oblique reflections can be achieved to reduce light absorption.

5. The procedure of the present invention is simple, and the invention has sufficient structural strength to be suitable for semiconductor materials such as nitrides, phosphides and arsenides, and meet the reliability requirements of various fields.

What is claimed is:

1. A light-emitting diode grain structure with multiple contact points, comprising:
   a P-type electrode;
   a conductive base plate, one side of the conductive base plate provided with the P-type electrode, the conductive base plate comprising a center region and a side region adjacent to the center region;
   a light-emitting semiconductor layer, arranged on the other side of the conductive base plate, the light-emitting semiconductor layer arranged on the center region of the conductive base plate, and the light-emitting semiconductor layer comprising a P-type semiconductor layer arranged on the conductive base plate, a quantum well layer arranged on the P-type semiconductor layer, and an N-type semiconductor layer arranged on the quantum well layer, the N-type semiconductor layer and the side region of the conductive base plate covered by an insulation layer;
   a plurality of ohmic contact metal points, arranged on the N-type semiconductor layer in a spreading manner, and the plurality of ohmic contact metal points contacts with the N-type semiconductor layer;
   a connection conductive layer, being a mesh structure and covering the N-type semiconductor layer, the connection conductive layer electrically connected to the plurality of ohmic contact metal points without ohmic contact formed between the connection conductive layer and the N-type semiconductor layer;
   a connection point conductive layer, arranged on the connection conductive layer, the connection point conductive layer electrically connected to the connection conductive layer, and the connection point conductive layer further extends to the side region of the conductive base plate and is arranged on the insulation layer; and
   an N-type electrode pad, arranged on the connection point conductive layer, and the N-type electrode pad electrically connected to the connection point conductive layer, the N-type electrode pad is located above the side region.

2. The light-emitting diode grain structure according to claim 1, wherein the N-type electrode pad is located above the N-type semiconductor layer.

3. The light-emitting diode grain structure according to claim 2, wherein a thickness of the N-type electrode pad is greater than 2 and a material of the N-type electrode pad is gold (Au).

4. The light-emitting diode grain structure according to claim 1, wherein a coverage area rate of the N-type semiconductor layer covered by the connection conductive layer is less than 30%.

5. The light-emitting diode grain structure according to claim 1, wherein a ratio of an aggregate thickness of the connection conductive layer and the connection point conductive layer to a line width is less than 2.0.

6. The light-emitting diode grain structure according to claim 1, wherein an edge of the connection conductive layer is a closed geometric figure.

7. The light-emitting diode grain structure according to claim 1, wherein a material of the connection conductive layer is a conductive metal which is in non-ohmic contact with the N-type semiconductor layer.

8. The light-emitting diode grain structure according to claim 1, wherein a contact plane between the N-type semiconductor layer and the connection conductive layer is passivated through ion bombardment, P-type dispersion or ion implantation.

9. The light-emitting diode grain structure according to claim 1, wherein a contact plane between the N-type semiconductor layer and the connection conductive layer is deposited by a thin film and covered by an insulation material.

10. The light-emitting diode grain structure according to claim 1, wherein a material of the plurality of ohmic contact metal points is a conductive metal which is contacted with the N-type semiconductor layer.

11. The light-emitting diode grain structure according to claim 1, wherein an electrode reflection plane externally protruding towards the N-type semiconductor layer is arranged between the plurality of ohmic contact metal points and the N-type semiconductor layer, and the conductive base plate is provided with a conductive metal light reflection layer in a region adjacent to the light-emitting semiconductor layer.

12. The light-emitting diode grain structure according to claim 1, wherein the plurality of ohmic contact metal points have different areas according to setting positions on the N-type semiconductor layer.

* * * * *